United States Patent [19]

Kitazawa et al.

[11] Patent Number: 5,350,457
[45] Date of Patent: Sep. 27, 1994

[54] PROCESS FOR CLEANING ELECTRONIC OR PRECISION PARTS AND RECYCLING RINSE WASTE WATER

[75] Inventors: Kozo Kitazawa; Eiji Kashihara, both of Wakayama, Japan

[73] Assignee: Kao Corporation, Tokyo, Japan

[21] Appl. No.: 112,325

[22] Filed: Aug. 27, 1993

Related U.S. Application Data

[60] Division of Ser. No. 86,460, Jul. 6, 1993, which is a continuation of Ser. No. 727,918, Jul. 10, 1991, abandoned.

[30] Foreign Application Priority Data

Jul. 10, 1990 [JP] Japan .................. 2-182443
Sep. 11, 1990 [JP] Japan .................. 2-240569

[51] Int. Cl.$^5$ .................. B08B 3/08; B08B 3/12
[52] U.S. Cl. .................. 134/10; 134/1; 134/26; 134/40
[58] Field of Search ............. 134/1, 10, 22.14, 22.19, 134/26, 40

[56] References Cited

U.S. PATENT DOCUMENTS

| | | | |
|---|---|---|---|
| 2,711,978 | 6/1955 | Groom .................. | 134/10 |
| 3,025,190 | 3/1962 | Groom .................. | 134/10 |
| 3,734,776 | 5/1973 | Keogh, Jr. . | |
| 3,802,917 | 4/1974 | Treat et al. .................. | 134/10 |
| 4,609,488 | 9/1986 | Geke et al. .................. | 252/344 |
| 4,651,762 | 3/1987 | Bowden .................. | 134/111 |
| 5,047,083 | 9/1991 | Blake et al. .................. | 134/40 X |
| 5,096,504 | 3/1992 | Chihara et al. .................. | 134/42 |
| 5,125,966 | 6/1992 | Siefert et al. .................. | 134/10 X |

FOREIGN PATENT DOCUMENTS 0426944 5/1991 European Pat. Off. .

*Primary Examiner*—Richard O. Dean
*Assistant Examiner*—Saeed Chaudhry
*Attorney, Agent, or Firm*—Oblon, Spivak, McClelland, Maier & Neustadt

[57] ABSTRACT

A detergent composition which can effectively cleanse electronic and precision parts and produces waste effluent water which is very easily treated is disclosed. The detergent composition comprises one or more nonionic surface active agents and, when diluted with water to a concentration of 5%, the aqueous solution has a cloud point of 5°–100° C. Disclosed is also a process for cleansing electronic and precision parts comprising the steps 1) to 3): 1) cleaning the electronic and precision parts with a detergent composition comprising one or more nonionic surface active agents and wherein a 5% by weight of aqueous solution of said detergent composition has a cloud point of 5°–100° C., or with an aqueous solution of this detergent composition, at a temperature below said cloud point, 2) rinsing the electronic and precision parts with a rinse water resulted in step 1) at a temperature of 5°–100° C., and 3) heating the rinse waste water to a temperature above its cloud point; thereby separating the oil components contained therein.

29 Claims, No Drawings

PROCESS FOR CLEANING ELECTRONIC OR PRECISION PARTS AND RECYCLING RINSE WASTE WATER

This is a division, of application Ser. No. 08/086,460, filed on Jul. 6, 1993, which is a continuation of application Ser. No. 07/727,918, filed on Jul. 10, 1991, now abandoned.

BACKGROUND OF THE INVENTION

1. Field of the Invention

This invention relates to a detergent composition for removing stains of oils and fats, machine oils, cutting oils, grease, liquid crystals, rosin-type fluxes, and the like attached to the solid surfaces of articles such as electronic and precision parts, and tools used for the assembly or fabrication of these parts (such parts and tools herein collectively called "electronic and precision parts"), and to a process for cleaning the electronic and precision parts using said detergent composition, which is characterized by the ease in treating the waste water discharged therefrom.

2. Description of the Background Art

Conventionally, hydrocarbon solvents, e.g. kerosene, benzene, xylene, etc.; chlorine-containing solvents, e.g. trichloroethylene, tetrachloroethylene, etc., Freon-type solvents, e.g. trichlorotrifluoroethane, etc.; aqueous type detergents comprising surface active agents, builders, etc.; and the like have been used for removing stains, of which the major components are oils and fats, machine oils, cutting oils, greases, liquid crystals, rosin-type fluxes, and the like, attached to the solid surfaces of precision parts and tools. In particular, Freon-type solvents and chlorine-containing solvents are used for removing stains on electronic, electrical, and machinery parts owing to their high detergency and flame retardance.

The detergent compositions containing a chlorine-containing solvent or a Freon-type solvent, however, have crucial problems in terms of the safety, toxicity, environmental pollution, and the like. Among hydrocarbon solvents, benzene and xylene are both specified as hazardous compounds under the Law Concerning Industrial Hygiene and Workmen's Safety because of their high toxicity, and are therefore undesirable solvents for use in a detergent composition. Special consideration must be given to avoid risks involved in handling these solvents.

Aqueous type detergents, on the other hand, are less hazardous and toxic than solvent type detergents. High detergency can be provided by properly selecting detergent components such as surface active agents, builders, and the like.

Aqueous type detergents containing various types of surface active agents are usually abundantly soluble in water. This is the cause of the drawback of these aqueous type detergents; i.e. difficulty in the treatment of waste water. The treatment of a detergent liquid after removing stains and the treatment of the waste water used to rinse the detergent liquid from the parts to be cleaned (such waste water herein called "rinse waste water") have conventionally been carried out by coagulation and sedimentation, pressure flotation, activated sludge treatment, or activated carbon treatment, or by the combination of two or more of these. These treatment processes, however, require large facilities involving enormous investment and operating costs.

The object of the present invention is therefore, with due consideration to the above problems and drawbacks in aqueous-type detergent compositions or the detergent composition of the type in which water is used for the rinse after washing, to provide a detergent composition of which the rinse waste water can easily be treated and which can effectively remove stains of oils and fats, machine oils, cutting oils, greases, liquid crystals, rosin-type fluxes, and the like from the solid surfaces of electronic and precision parts. Another object of the present invention is to provide an industrially advantageous process for cleaning electronic and precision parts without requiring large facilities involving huge investment cost and high operating costs.

The present inventors have undertaken extensive studies and have found that the above objects can be achieved by a detergent composition comprising, as a detergent ingredient, one or more nonionic surface active agents, of which a 5% by weight aqueous solution has a cloud point of 5°–100° C.

The present inventors have further found that the rinse waste water after cleaning the electronic and precision parts with the detergent composition and after rinsing at a temperature of 5°–100° C. can easily separate out the oil components contained therein, such as oil stains and detergent components, if heated to a temperature above the cloud point, thereby remarkably improving the waste water treatment process and ensuring recycling of the rinse water from which the oil components have been eliminated.

SUMMARY OF THE INVENTION

Accordingly, an object of the present invention is to provide a detergent composition for cleaning electronic and precision parts, comprising one or more nonionic surface active agents and wherein a 5% by weight (hereinafter referred to simply as %) of aqueous solution of said detergent composition has a cloud point of 5°–100° C.

Another object of the present invention is to provide a process for cleaning electronic and precision parts, which comprises the steps 1) to 3):

1) cleaning the electronic and precision parts with a detergent composition comprising one or more nonionic surface active agents and wherein a 5% by weight of aqueous solution of said detergent composition has a cloud point of 5°–100° C., or with an aqueous solution of this detergent composition, at a temperature below said cloud point (herein called "cleaning step"), 2) rinsing the electronic and precision parts with a rinse water resulted in step 1) at a temperature of 5°–100° C. (herein called "rinse step", and 3) heating the rinse waste water to a temperature above its cloud point (herein called "separation step"); thereby separating the oil components contained therein.

Other objects, features and advantages of the invention will hereinafter become more readily apparent from the following description.

DETAILED DESCRIPTION OF THE INVENTION AND PREFERRED EMBODIMENTS

"Cloud point" used here is defined as a temperature at which a 5% solution of the detergent composition of the present invention in ion-exchanged water began to become turbid when the solution in a 10–30 ml test tube is first cooled to 0° C. and then allowed to raise its temperature at a rate of 1° C. per minute.

Nonionic surface active agents used in the present invention may be those classified under the nonionic surface active agents in "Handbook of Surface Active Agent" (pages 37-45, published by Sangyo Tosho Publishing Co.). They include, for example, ether-type surface active agents, e.g. alkyl ether-type, alkylaryl ether-type, alkylthio ether-type; ester-type surface active agents, e.g. alkylester-type, sorbitan alkylester-type; condensed amine-polyoxyalkylene-type surface active agents, e.g. polyoxyalkylenealkylamine; condensed amide-polyoxyalkylene-type surface active agents, e.g. polyoxyaikyleneaikylamide; Pluronic or Tetronic-type surface active agents which are random or block condensation products of polyoxyethylene and polyoxypropylene; polyethyleneimine-type surface active agents; and the like. Of these, particularly preferable are nonionic surface active agents having a hydrocarbon residue having 4-22 carbon atoms. Such nonionic surface active agents provide a detergent composition with increased affinity toward oil stains, thus promoting the detergency of the composition. In addition, they give a distinct cloud point to the rinse waste water into which they are mingled.

The amount of the nonionic surface active agents to be incorporated into the detergent composition of the present invention is preferably 2-100% by weight, and particularly preferably 2-90% by weight. An amount less than 2% by weight decreases the detergency of the composition, while the detergency proportionate to the amount cannot be obtained by the incorporation exceeding 90% by weight.

The above-mentioned nonionic surface active agents lose their solubility in water at temperatures above the cloud point of the detergent composition, and are expelled from water. This forces oil stains and the like held in the water to deposit as precipitating or floating materials depending on their specific gravity, thus ensuring the removal of oil stains by a simple procedure such as scoop-up or the like.

A detergent composition having a cloud point within a specific temperature range can expel oil stains as well as nonionic surface active agents contained in water by simply heating it to a temperature above the cloud point, making the removal of oil stains possible with simple sewage treatment facilities, in a short period of time, and at a low cost.

It is essential that the 5% aqueous solution of the detergent composition of the present invention have a cloud point of 5°-100° C. A more preferable cloud point range is 20°-90° C. If the cloud point is lower than 5° C., the efficiency of rinsing with water to be carried out after cleaning decreases. This is because a rinse operation using water is usually carried out above normal water temperature (5° C.) for a better rinse efficiency. If the cloud point is lower than the temperature at which the rinse is performed, the detergent liquid attached to the surfaces to be cleaned can be removed only with difficulty. If the cloud point is higher than 100° C., on the other hand, the waste water treatment facilities must have special devices, e.g. a device for pressurizing, to rinse at a temperature above the cloud point, resulting in an increase in the treatment cost.

It is desirable that a 5% aqueous solution of the detergent composition of the present invention, when maintained at a temperature above the cloud point for 30 minutes or more, separates 30% by weight or more, preferably 50% by weight or more, of organic components contained in the detergent from the water. The degree of separation of organic components can readily be determined by comparing CODs (chemical oxygen demand) of the aqueous solution before and after heating to the cloud point. The greater the separation degree, the larger is the amount of nonionic surface active agents which have lost their activity, thus indicating a better waste water treatment effect. Beside the nonionic surface active agents, various other components may be added to the detergent composition of the present invention inasmuch as the effect of the present invention is not impaired. Such components include other surface active agents which are used in common detergent compositions, organic or inorganic compounds having a chelating activity, antiseptics, rust preventives, antifoaming agents, antioxidant, hydrocarbon solvents, amine-type additives, alcohols, water, and the like.

The cleaning process of the present invention is hereinafter illustrated.

A method used in the cleaning step may be the dipping method, ultrasonic cleaning method, shaking method, spray method, or the like, or the combination of two or more of these. The cleaning is performed at a temperature below the cloud point. If the cleaning temperature is above the cloud point, the detergent composition becomes turbid, resulting in insufficient cleaning.

The rinse liquid is used to rinse the detergent liquid containing oil stains and the detergent composition in the rinsing step. Although pure water is preferable for use as a rinse liquid, rinse waste water after removal of oil components is preferably used in practice.

Rinse may be performed by the dipping method, ultrasonic method, shaking method, spray method, or the like, using a rinse liquid at a temperature of 5°-100° C. A temperature outside the 5°-100° C. range is not only uneconomical but also undesirable from the aspect of facilities required for the rinsing at such a temperature. An especially preferable rinse temperature range is below the cloud point of the detergent composition.

In the separation step, the rinse waste water is heated above its cloud point. Here, the cloud point of a rinse waste water is determined in the same manner as that of the detergent composition without diluting the rinse waste water. The cloud point of a rinse waste water is almost the same as the cloud point of the detergent composition used for the cleaning.

The rinse waste water is kept in the separation step by heating above its cloud point, preferably a temperature higher than the cloud point by 5° C. or more. As mentioned above, nonionic surface active agents contained in the rinse waste water is become insoluble, causing oil stains, such as fluxes, emulsified or dissolved therein to separate from the rinse waste water.

Removal of the separated nonionic surface active agents and oil components floating on the surface of the waste water or precipitated in the bottom is carried out by scooping them in the effluent receiving tank or separation tank, by continuously extracting them, or by using auxiliary equipment such as filters.

The rinse effluent can be cleaned by an efficient separation procedure and circulated for reuse as rinse water.

If necessary, an ion-exchange treatment, an absorption treatment, a treatment by activated carbon or by filter, or the like may further be used in order to remove organic materials such as water soluble nonionic surface active agents and the like.

The detergent composition of the present invention exhibits an exceptionally excellent effect when applied to cleaning of solid surfaces of articles such as electronic and precision parts, and tools used for the assembly or fabrication of these parts. Electronic and precision parts herein include any parts of electronic appliances, electric machines, precision equipment, resin processing machines, optical instruments, and the like. Parts of electronic appliances include, for example, print circuit boards used in computers and their peripheral equipment, electronic appliances for household use, communication equipment, OA equipment, and other electronic-related articles; hoops used as connection parts for IC lead frames, resistors, condensers, relays, etc.; liquid crystal image displays used for OA equipment, watches, computers, toys, etc.; semiconductor materials such as silicon or ceramic wafers; parts used in crystal oscillators; parts for photoelectric transfer used in CD, FD, copying machine, optical resistors, etc.; and the like. Parts for electric machines include, for example, motor parts such as brushes, roters, stators, housing, etc.; parts of dispensers such as ticket dispensers, soft drink dispensers. etc; parts for bill inspection machines used for cash dispensers, etc.; and the like. Parts for precision equipment include, for example, bearings used in minute motors, video recorders, etc; ultra-hard tips; and the like. Resin processing parts include, for example, lenses used in cameras, glasses, optical equipment, etc., glass frames, watch cases, watch belts, etc.; and the like.

Assembly or fabrication parts herein include any tools, instruments, and devices used for the manufacture, processing, assembly, fabrication, and finishing of various parts mentioned above, as well as various instruments, their parts, and the like for handling the above precision parts.

The detergent composition of the present invention exhibits particularly outstanding capability when applied to the removal of fluxes remaining on the surfaces of printed circuit boards or the cleansing of liquid crystals attached to glass substrates. The objects to be cleaned by the application of the detergent composition of the present invention are not limited to the above-mentioned electronic or precision parts, tools, or instruments. It can be applied to any and all electronic or precision parts, tools, or instruments having a solid surface of any configuration, to which is attached any contaminant or substance which may interfere the subsequent assembling or processing operations, e.g. oils, fluxes, etc.

The detergent composition of the present invention can exhibit a particularly good performance, when such a contaminating substance is stains of which the major component is organic oils such as oils and fats, machine oils, cutting oils, grease, liquid crystals, rosin-type fluxes, and the like. Inclusion of metallic powders, inorganic powders, and the like in the oil stains does not inhibit the effect of the detergent composition of the present invention.

Other features of the invention will become apparent in the course of the following description of the exemplary embodiments which are given for illustration of the invention and are not intended to be limiting thereof.

EXAMPLES

Examples 1–15 and Comparative Examples 1–5

Detergent compositions with formulations shown in Table 1 were prepared and the cloud point of a 5% aqueous solution of each composition was determined. The results are shown in Table 1.

Ten (10) sheets of (i) print circuit boards treated with flux, (ii) copper boards to which naphthenic mineral oil was applied, and (iii) glass plates to which nematic liquid crystal was applied were respectively dipped into the detergent compositions of (i) Examples 1–5 and Comparative Examples 1 and 4; (ii) Examples 6–10 and Comparative Example 2; and (iii) Examples 11–15 and Comparative Examples 3 and 5, and cleansed at 40° C. for 3 minutes while ultrasonic wave was applied. They were rinsed with ion-exchanged water at 20° C. in order to evaluate their rinsability. The results are shown in Table 1.

The rinse was further continued until the concentration of the detergent composition in the rinse waste water became 5% by weight. COD of the water layer when the rinse waste water was kept above the cloud point within the 5°–100° C. range and COD of the water layer below the cloud point were compared to evaluate the separability of organic components according to the following criterion. The results are given in Table 1.

<Criterion of Rinsability>
AAA: Excellent
BBB: Good
CCC: A slight amount of detergent composition remained attached
BBB: A large amount of detergent composition remained attached <Criterion of Separability>
AAA: Excellent; The degree of the separation was 60% by weight or more.
BBB: Good; The degree of the separation was 30% by weight or more.
CCC: The degree of the separation was insufficient.
BBB: Organic components hardly separated.

TABLE 1

| Component | Example 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| (POE)$_5$(POP)$_2$ ethyl ether | 20 | — | — | — | — | — | — | — | — | — | 50 | — | — | — | — |
| (POE)$_3$ hexyl ether | — | 30 | — | — | — | — | — | — | — | — | — | — | — | — | — |
| (POE)$_{10}$ lauryl ether | — | — | — | 20 | — | — | 10 | — | — | — | — | 25 | — | — | — |
| (POE)$_{20}$ stearyl ether | — | — | 15 | — | — | — | — | — | — | — | — | — | — | — | — |
| (POE)$_{10}$ oleylamine | — | — | — | — | 30 | — | — | — | — | — | — | — | — | 30 | — |
| (POE)$_{20}$ dibutyl ester | — | — | — | — | — | 15 | — | — | — | — | 20 | — | — | — | — |
| (POE)$_{30}$(POP)$_{15}$ | — | — | 5 | — | — | — | 10 | — | — | — | — | — | — | — | — |
| (POE)$_{15}$ nonyl phenyl ether | — | — | — | — | 10 | — | — | — | — | — | — | — | 20 | — | 5 |
| (POE)$_{16}$ sorbitan oleate | — | — | — | — | — | — | — | 15 | — | — | — | — | — | — | — |
| (POE)$_5$(POP)$_2$ adduct of furfuryl alcohol | — | 60 | — | — | — | — | — | — | 70 | — | — | — | — | — | — |
| (POE)$_5$(POB)$_3$ laurylamine | — | — | — | — | — | — | 5 | — | — | 20 | — | — | — | — | — |
| (POE)$_{10}$ dodecyl ether-methyl ether | — | — | — | — | 10 | — | — | — | — | — | — | — | — | 70 | — |
| (POE)$_3$ decyl ester | — | — | — | 5 | — | — | — | — | 10 | — | — | — | 45 | — | — |

TABLE 1-continued

| Component | | | | | | | | | | | | | | | |
|---|---|---|---|---|---|---|---|---|---|---|---|---|---|---|---|
| (POE)$_{90}$ nonylphenol ether | — | — | — | — | — | — | — | — | — | 5 | — | — | — | — | — |
| Sodium dodecylbenzene sulfonate | — | — | 5 | — | — | — | — | 4 | — | — | — | 5 | — | — | — |
| Triethanolamine | — | — | — | — | — | 1 | — | — | 1 | — | — | — | — | — | — |
| Water | 80 | 10 | 75 | 75 | 60 | 74 | 75 | 81 | 19 | 75 | 30 | 70 | 35 | 0 | 95 |
| Cloud point (°C.) | 58 | 35 | 85 | 28 | 34 | 26 | 75 | 68 | 41 | 65 | 30 | 47 | 8 | 15 | 85 |
| Soil components | | | | | | | | | | | | | | | |
| Flux | 0 | 0 | 0 | 0 | 0 | — | — | — | — | — | — | — | — | — | — |
| Naphthenic oil | — | — | — | — | — | 0 | 0 | 0 | 0 | 0 | — | — | — | — | — |
| Liquid crystals | — | — | — | — | — | — | — | — | — | — | 0 | 0 | 0 | 0 | 0 |
| Evaluation results | | | | | | | | | | | | | | | |
| Rinsability | B-A | B-A | A | B-A | B-A | B-A | A | A | B-A | A | B-A | B-A | B | B | A |
| Separability | B | A | A | A | A | B | A | A | B | A | A | A | A | A | B |

| Component | Comparative Example 1 | 2 | 3 | 4 | 5 |
|---|---|---|---|---|---|
| (POE)$_5$(POP)$_2$ ethyl ether | — | — | — | — | — |
| (POE)$_3$ hexyl ether | — | — | — | — | — |
| (POE)$_{10}$ lauryl ether | — | — | 5 | — | — |
| (POE)$_{20}$ stearyl ether | — | — | — | — | — |
| (POE)$_{10}$ oleylamine | — | — | — | — | — |
| (POE)$_{20}$ dibutyl ester | — | — | — | — | — |
| (POE)$_{30}$(POP)$_{15}$ | — | — | — | — | — |
| (POE)$_{15}$ nonyl phenyl ether | — | — | — | — | — |
| (POE)$_{16}$ sorbitan oleate | — | — | — | — | — |
| (POE)$_5$(POP)$_2$ adduct of furfuryl alcohol | — | — | — | — | — |
| (POE)$_5$(POB)$_3$ laurylamine | — | — | — | — | — |
| (POE)$_{10}$ dodecyl ether-methyl ether | — | — | — | — | — |
| (POE)$_3$ decyl ester | — | — | — | — | 100 |
| (POE)$_{90}$ nonylphenol ether | 15 | — | — | 10 | — |
| Sodium dodecylbenzene sulfonate | — | 30 | 15 | 5 | — |
| Triethanolamine | — | — | — | — | — |
| Water | 85 | 70 | 80 | 85 | — |
| Cloud point (°C.) | >100 | >100 | >100 | >100 | 0< |
| Soil components | | | | | |
| Flux | 0 | — | — | 0 | — |
| Naphthenic oil | — | 0 | — | — | — |
| Liquid crystals | — | — | 0 | — | 0 |
| Evaluation results | | | | | |
| Rinsability | B | A | B | B | D |
| Separability | D | D | D | D | A |

*(POE)$_n$: Polyoxyethylene, (POP)$_n$: Polyoxypropylene, (POB)$_n$: Polyoxybutylene, n: average addition mol The results in Table 1 shows superior detergency and rinsability of the detergent compositions of the present invention in cleansing and rinsing of precision parts.

Examples 16-24, Comparative Examples 6-8

Detergent compositions with formulations shown in Table 2 were prepared and diluted to 20-fold with ion-exchanged water to measure their cloud points. The detergent compositions were used to ultrasonically cleanse the following test pieces.

Test piece 1: Print circuit boards (10 cm × 15 cm) treated with flux.

Test piece 2: Steel test piece (10 cm × 15 cm) to which naphthenic oil (40° C., 350 cSt) was applied (1 g/m$^2$)

Test piece 3: Glass plate (10 cm × 10 cm) to which liquid crystals were applied (5 g/m$^2$)

After cleansing, test pieces were dipped into ion-exchanged water at 25° C. and ultrasonically rinsed for 1 minute. All test pieces after the rinse had good outward appearance.

The rinse waste water was allowed to stand still for 30 minutes at a temperature (maximum temperature: below 100° C.) 10°-20° C. higher than above its cloud point. All rinse waste waters according to the present invention separated oil components in either upper or lower layer. COD of the water layer was measured (A value) and was compared with the COD before the rinse was performed (B value), to determine the oil component separation rate: [(B−A)/B]×100. The results are shown in Table 2.

TABLE 2

| | Example 16 | 17 | 18 | 19 | 20 | 21 | 22 | 23 | 24 | Example Comparative 6 | 7 | 8 |
|---|---|---|---|---|---|---|---|---|---|---|---|---|
| Subject to be cleansed | | | | | | | | | | | | |
| Test piece 1 | 0 | 0 | 0 | — | — | — | — | — | — | 0 | — | — |
| Test piece 2 | — | — | — | 0 | 0 | 0 | — | — | — | — | 0 | — |
| Test piece 3 | — | — | — | — | — | — | 0 | 0 | 0 | — | — | 0 |
| Formulation of detergent composition | | | | | | | | | | | | |
| (POE)$_5$ nonylphenol ether | 80 | 10 | 10 | 30 | — | — | 10 | 5 | — | — | 5 | — |
| (POE)$_{10}$ lauryl ether | — | 20 | — | — | — | 15 | — | 35 | — | — | — | 5 |
| (POE)$_{35}$ oleyl ether | — | — | — | 10 | — | — | — | — | 10 | 20 | — | 35 |
| (POE)$_{15}$(POP)$_2$ decyl ether | 20 | — | 35 | — | 30 | — | 70 | — | 65 | — | — | — |
| Sodium dedecylbenzene sulfonate | — | — | — | — | 2 | — | — | 2 | — | 10 | 20 | — |
| Sodium oleate | — | — | 5 | — | — | — | — | — | — | — | — | — |
| Triethanolamine | — | 2 | 1 | — | — | — | — | — | — | 2 | — | — |

TABLE 2-continued

|  | Example | | | | | | | | | Example Comparative | | |
| --- | --- | --- | --- | --- | --- | --- | --- | --- | --- | --- | --- | --- |
|  | 16 | 17 | 18 | 19 | 20 | 21 | 22 | 23 | 24 | 6 | 7 | 8 |
| Water | 0 | 68 | 49 | 60 | 68 | 85 | 0 | 58 | 25 | 68 | 75 | 60 |
| Cloud point of the detergent composition (20-fold dilution; °C.) | 6 | 65 | 32 | 35 | 45 | 87 | 28 | 90 | 35 | 100< | 100< | 100< |
| COD of rinse water (Mn method, g/l) | | | | | | | | | | | | |
| Before rinse (A) | 9 | 11 | 19 | 1 | 3 | 2 | 2 | 2 | 2 | 47 | 23 | 3 |
| After rinse (B) | 75 | 45 | 50 | 25 | 24 | 21 | 15 | 10 | 12 | 50 | 26 | 11 |
| Rate of oil component separation | 88 | 75 | 61 | 95 | 87 | 90 | 85 | 80 | 83 | 5 | 10 | 7 |

$(POE)_n$: Polyoxyethylene, $(POP)_n$: Polyoxypropylene

The results of Table 2 show that the compositions of Examples 16-24 can separate oil components at a higher rate and that the rinse water from which the oil components have been separated have a low COD value evidencing that the water contains very little oil components.

All rinse waters from which at least 50% of oil components have been eliminated (all example compositions meet this criterion) were confirmed to be reusable as a rinse water in the rinse step of the claimed process. Especially, water layers from which 70% or more of oil components have been eliminated exhibited excellent rinsability.

As illustrated above, the detergent composition herein disclosed exhibits excellent detergency and the rinse waste water can be treated with ease. It can be applied with advantage to the cleansing of electronic and precision parts, and tools used for the assembly or fabrication of these parts. Especially, the process of the present invention can afford an industrially advantageous cleansing process of these parts, since it can greatly decrease oil components contained in the rinse waste water, thus simplifying the subsequent effluent treatment. Furthermore, the process brings about an economic advantage by ensuring the reclamation and reuse of the rinse waste water after separation of oil components.

Obviously, numerous modifications and variations of the present invention are possible in light of the above teachings. It is therefore to be understood that within the scope of the appended claims, the invention may be practiced otherwise than as specifically described herein.

What is claimed is:

1. A process for cleaning an electronic or precision part, which comprises the steps:

(1) contacting an electronic or precision part with a detergent composition wherein said detergent composition consists essentially of 2-100% of one or more nonionic surface active agents and up to 5% by wt. of an anionic surfactant wherein a 5% by weight aqueous solution of said detergent composition has a cloud point of 5°-100° C., or with an aqueous solution of said detergent composition, wherein said contacting is carried out at a temperature below the cloud point of said detergent composition or said aqueous solution of said detergent composition, to obtain a washed electronic or precision part;

(2) rinsing said washed electronic or precision part with rinse water at a temperature of 5°-100° C., to obtain rinse waste water and a rinsed electronic or precision part; and (3) heating said rinse waste water to a temperature above its cloud point, to obtain (a) an aqueous phase comprising purified rinse waste water and (b) an oil component phase, wherein said rinse water in said rinsing (2) is purified rinse waste water obtained from said heating (3).

2. The method of claim 1, wherein said contacting comprises dipping said electronic or precision part in said detergent composition or aqueous solution of said detergent composition.

3. The method of claim 1, wherein said contacting comprises ultrasonic cleaning of said electronic or precision part in said detergent composition or said aqueous solution of said detergent composition.

4. The method of claim 1, wherein said contacting comprises shaking said electronic or precision part in said detergent composition or said aqueous solution of said detergent composition.

5. The method of claim 1, wherein said contacting comprises spraying said electronic or precision part with said detergent composition or said aqueous solution of said detergent composition.

6. The method of claim 1, wherein said rinse water is pure water.

7. The method of claim 1, wherein said rinsing comprises dipping said washed electronic or precision part in said rinse water.

8. The method of claim 1, wherein said rinsing comprises ultrasonic rinsing of said washed electronic or precision part in said rinse water.

9. The method of claim 1, wherein said rinsing comprises shaking said washed electronic or precision part in said rinse water.

10. The method of claim 1, wherein said rinsing comprises spraying said electronic or precision part with said rinse water.

11. The method of claim 1, wherein said heating of said rinse waste water comprises heating said rinse water to a temperature which is 5° C. or more higher than the cloud point of said rinse waste water.

12. The method of claim 1, wherein said oil component phase is separated from said aqueous phase, to obtain purified rinse waste water.

13. The method of claim 12, wherein said oil component phase is separated from said aqueous phase by scooping said oil component phase.

14. The method of claim 12, wherein said oil component phase is separated from said aqueous phase by extraction.

15. The method of claim 12, wherein said oil component phase is separated from said aqueous phase by filtration.

16. The method of claim 12, wherein said purified rinse waste water is further purified by a method selected from the group consisting of ion-exchange, contacting with activated carbon, and filtration.

17. The process of claim 1, wherein said anionic surfactant is present in said detergent composition in an amount of from 2 to 5% by weight.

18. The process of claim 1, wherein said anionic surfactant is selected from the group consisting of sodium dodecylbenzenesulfonate and sodium oleate.

19. The process of claim 1, wherein said nonionic surface active agent is selected from the group consisting of alkyl ethers, alkylaryl ethers, alkylthio ethers, alkyl esters, sorbitan alkyl esters, polyoxyalkylenealkylamines, polyoxyalkylenealkylamides, random and block condensation products of polyoxyethylene and polyoxypropylene, and polyethyleneimines.

20. The process of claim 19, wherein said anionic surfactant is present in said detergent composition in an amount of 2–5 wt. %.

21. The process of claim 19, wherein said at least one nonionic surface active agent is present in said detergent composition in an amount of 2–90% by weight.

22. The process of claim 19, wherein said nonionic surface active agent has a hydrocarbon residue having 4–22 carbon atoms.

23. The process of claim 19, wherein said anionic surfactant is present in said detergent composition in an amount of 2–5% by weight and said at least one nonionic surface active agent is present in said detergent composition in an amount of 2–90% by weight.

24. The process of claim 19, wherein said anionic surfactant is selected from the group consisting of sodium dodecylbenzenesulfonate and sodium oleate.

25. The process of claim 19, wherein said anionic surfactant is present in said detergent composition in an amount of 2–5% by weight, said at least one nonionic surface active agent is present in said detergent composition in an amount of 2–90% by weight, and said nonionic surface active agent has a hydrocarbon residue having 4–22 carbon atoms.

26. The process of claim 25, wherein said anionic surfactant is selected from the group consisting of sodium dodecylbenzenesulfonate and sodium oleate.

27. The process of claim 1, wherein said detergent composition contains 2–90% of one or more nonionic surface active agents.

28. The process of claim 27, wherein said anionic surfactant is present in said detergent composition in an amount of 2–5% by weight.

29. The process of claim 27, wherein said nonionic surface active agent has a hydrocarbon residue having 4–22 carbon atoms.

* * * * *